(12) United States Patent
Singh

(10) Patent No.: US 9,905,668 B2
(45) Date of Patent: Feb. 27, 2018

(54) BIPOLAR JUNCTION TRANSISTORS AND METHODS OF FABRICATION

(71) Applicant: GLOBALFOUNDRIES Inc., Grand Cayman (KY)

(72) Inventor: Jagar Singh, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 53 days.

(21) Appl. No.: 15/057,791

(22) Filed: Mar. 1, 2016

(65) Prior Publication Data

US 2016/0181393 A1    Jun. 23, 2016

Related U.S. Application Data

(62) Division of application No. 14/339,505, filed on Jul. 24, 2014, now Pat. No. 9,312,371.

(51) Int. Cl.
| | |
|---|---|
| *H01L 29/66* | (2006.01) |
| *H01L 29/06* | (2006.01) |
| *H01L 29/78* | (2006.01) |
| *H01L 29/739* | (2006.01) |
| *H01L 29/45* | (2006.01) |
| *H01L 29/40* | (2006.01) |
| *H01L 29/735* | (2006.01) |

(Continued)

(52) U.S. Cl.
CPC .... *H01L 29/66325* (2013.01); *H01L 29/0692* (2013.01); *H01L 29/402* (2013.01); *H01L 29/41708* (2013.01); *H01L 29/45* (2013.01); *H01L 29/6625* (2013.01); *H01L 29/735* (2013.01); *H01L 29/7393* (2013.01); *H01L 29/0808* (2013.01); *H01L 29/0821* (2013.01)

(58) Field of Classification Search
CPC .................... H01L 29/66325; H01L 29/41708
USPC ......................................................... 438/270
See application file for complete search history.

(56) References Cited

U.S. PATENT DOCUMENTS

| | | |
|---|---|---|
| 4,047,220 A | 9/1977 | Ferro et al. |
| 6,169,300 B1 | 1/2001 | Fragapane |

(Continued)

OTHER PUBLICATIONS

Hasler et al., "Floating-Gate Devices, Circuits, and Systems", 9th International Database Engineering & Application Symposium (IDEAS 2005), Atlanta, Georga, 6 pages.

(Continued)

*Primary Examiner* — Joseph C Nicely
*Assistant Examiner* — Thai T Vuong
(74) *Attorney, Agent, or Firm* — Heslin Rothenberg Farley & Mesiti P.C.; Nathan B. Davis

(57) ABSTRACT

A structure, including a bipolar junction transistor and method of fabrication thereof, is provided herein. The bipolar junction transistor includes: a substrate including a substrate region having a first conductivity type; an emitter region over a first portion of the substrate region, the emitter region having a second conductivity type; a collector region over a second portion of the substrate region, the collector region having the second conductivity type; and, a base region overlie structure disposed over, in part, the substrate region. The base region overlie structure separates the emitter region from the collector region and aligns to a base region of the bipolar junction transistor within the substrate region, between the first portion and the second portion of the substrate region.

20 Claims, 5 Drawing Sheets

(51) Int. Cl.
*H01L 29/417* (2006.01)
*H01L 29/08* (2006.01)

(56) References Cited

U.S. PATENT DOCUMENTS

| | | |
|---|---|---|
| 6,423,603 B2 | 7/2002 | Groves et al. |
| 6,469,366 B1 | 10/2002 | Nakashima et al. |
| 2005/0056827 A1 | 3/2005 | Li et al. |
| 2010/0187656 A1* | 7/2010 | Ke .................... H01L 29/73 257/586 |
| 2012/0068309 A1 | 3/2012 | Diefenbeck |
| 2012/0098096 A1* | 4/2012 | Lin .................... H01L 29/6625 257/565 |
| 2013/0146978 A1 | 6/2013 | Mahalingam et al. |
| 2013/0299944 A1 | 11/2013 | Lai et al. |
| 2013/0313571 A1 | 11/2013 | Konstantinov |
| 2014/0011745 A1 | 5/2014 | Koyama et al. |
| 2014/0239451 A1 | 8/2014 | Ito et al. |
| 2014/0291765 A1 | 10/2014 | Duyang et al. |

OTHER PUBLICATIONS

Jaeger, "Introduction to Microelectronic Fabrication", vol. 5, Second Edition, Prentice Hall, Upper Saddle River, New Jersey 07458 (2002), 14 pages.
Chu, "Bipolar Transistor", ch08vc.fm, Friday, Feb. 13, 2009, 34 pages.
NXP Product Information Page—Transistors for any RF function, downloaded Jul. 22, 2014, http://www.nxp.com/products/rf/transistors/bipolar/Inas_mixers_frequency_multipliers_buffers/3_5_ghz_gt_6_ghz_s_c_band/, 2 pages.

* cited by examiner

BIPOLAR JUNCTION TRANSISTORS AND METHODS OF FABRICATION

CROSS REFERENCE TO RELATED APPLICATIONS

This application is a divisional application of U.S. patent application Ser. No. 14/339,505, filed Jul. 24, 2014, and entitled "BIPOLAR JUNCTION TRANSISTORS AND METHODS OF FABRICATION," the entirety of which is hereby incorporated herein by reference.

FIELD OF THE INVENTION

The present invention generally relates to fabricating circuit structures, and more specifically, to bipolar junction transistors and methods of fabrication thereof.

BACKGROUND

Advances in mobile computing and communication technologies have driven demand for circuit structures capable of high performance and low power consumption for a wide variety of applications. Ideally such circuit structures may be manufactured at low cost using inexpensive materials and using established, cost-effective manufacturing tools and techniques. These objectives continue to drive innovation in the development of energy-efficient, high-speed circuit structures, as well as processes for fabricating such circuit structures.

SUMMARY OF THE INVENTION

The shortcomings of the prior art are overcome and additional advantages are provided through the provision, in one aspect, of a structure including a bipolar junction transistor which includes: a substrate including a substrate region having a first conductivity type; an emitter region over a first portion of the substrate region, the emitter region having a second conductivity type; a collector region over a second portion of the substrate region, the collector region having the second conductivity type; and, a base region overlie structure disposed over, in part, the substrate region, the base region overlie structure separating the emitter region from the collector region and aligning to a base region of the bipolar junction transistor within the substrate region between the first portion and the second portion thereof.

Also provided herein, in another aspect, is a method of fabricating a bipolar junction transistor, in which the fabricating includes: providing a substrate including a substrate region having a first conductivity type; providing a base region overlie structure over at least a portion of the substrate region, the base region overlie structure being aligned to a base region portion of the substrate region; forming an emitter region of a second conductivity type in a first portion of the substrate region and a collector region of the second conductivity type in a second portion of the substrate region, the first and second portions being disposed on opposing sides of the base region overlie structure; and, wherein the base region overlie structure masks the base region during the forming of the emitter region and the collector region.

Additional features and advantages are realized through the techniques of the present invention. Other embodiments and aspects are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
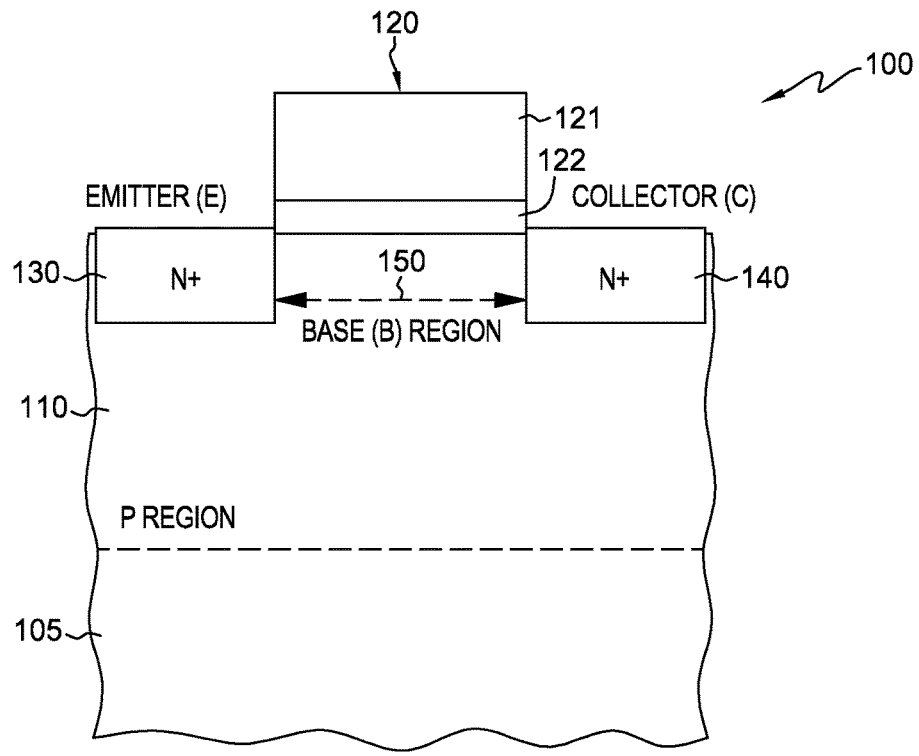
FIG. 1A depicts a cross-sectional view of one embodiment of a bipolar junction transistor structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Battery-operated mobile technologies have created and driven demand for circuit structures capable of high performance and speed at low power (low voltage) consumption. In particular, many mobile technologies make use of radio-frequency (RF) circuit structures for a wide range of applications, such as low-noise amplifiers, high output amplifiers, mixers, drivers, oscillators, frequency multipliers, and so on. Generally, RF circuit structures are designed to receive a low power signal or low input current and output an amplified signal or current. Bipolar junction transistors (or "bipolars"), which use a small input current to drive a large output current, may thus be well suited for some RF applications. However, designs of many bipolars are not without drawbacks. For example, some bipolars may operate only at high voltages (and thus high power consumption) to generate high output currents, and may have relatively long turn-on and turn-off times compared to other circuit structures, such as MOSFETs, resulting in additional power losses. As well, some bipolar designs may introduce high parasitic capacitances or parasitic resistances within the transistor, which may increase power losses as well as slower performance of the transistor. Designing RF circuit structures to resolve one or more of these issues generally introduces high manufacturing costs, whether due to expenses in materials, expenses in processing, increased fabrication time or a combination of cost factors.

Thus, provided herein, in one aspect, is a structure including a bipolar junction transistor designed to resolve one or more of the issues described above, the bipolar junction transistor including: a substrate including a substrate region having a first conductivity type; an emitter region over a first portion of the substrate region, the emitter region having a second conductivity type; a collector region over a second portion of the substrate region, the collector region having the second conductivity type; and, a base region overlie structure disposed over, in part, the substrate region, the base region overlie structure separating the emitter region from the collector region and aligning to a base region of the bipolar junction transistor within the substrate region between the first portion and the second portion thereof.

Also provided herein, in another aspect, is a method of fabricating a bipolar junction transistor, in which the fabricating includes: providing a substrate including a substrate region having a first conductivity type; providing a base region overlie structure over at least a portion of the substrate region, the base region overlie structure being aligned to a base region portion of the substrate region; forming an emitter region of a second conductivity type in a first portion of the substrate region and a collector region of the second conductivity type in a second portion of the substrate region, the first and second portions being disposed on opposing sides of the base region overlie structure; and, wherein the base region overlie structure masks the base region during the forming of the emitter region and the collector region.

Reference is made below to the drawings, which are not drawn to scale for ease of understanding, wherein the same reference numbers used throughout different figures designate the same or similar components.

FIG. 1A is a cross-sectional view of a portion of one embodiment of a bipolar junction transistor 100, in accordance with one or more aspects of the present invention. Bipolar junction transistor 100 includes a substrate 105 and a substrate region 110 over the substrate, the substrate region 110 having a first conductivity type. As illustrated by FIG. 1A, the first conductivity type of substrate region 110 may be P-type. A base overlie structure 120 may be provided and disposed over, in part, substrate region 110 and aligned to a base region 150 of bipolar junction transistor 100. Base overlie structure 120 may include, for example, a dielectric layer 122 and a conductive material layer 121 disposed over the dielectric layer 122. Base overlie structure 120 may be defined, in one example, by a lithographic etch process. Bipolar junction transistor 100 also includes an emitter region 130 over a first portion of substrate region 110 and a collector region 140 over a second portion of substrate region 110, the first portion and second portion having a second conductivity type. As illustrated by FIG. 1A, the second conductivity type may be N-type or a similar conductivity type, such as N+ type. In an exemplary embodiment, bipolar junction transistor 100 may be a lateral NPN bipolar transistor, as described above and as illustrated by FIG. 1A. Alternatively, emitter region 130 and collector region 140 may be P-type or P+ type and base region 150 may be N-type. However, as the mobility of N-type carriers (electrons) is generally higher than the mobility of P-type carriers (holes), a lateral NPN bipolar transistor may allow for greater current flow from emitter 130 and collector 140 through base region 150, and thus may also allow for faster operation and performance of bipolar junction transistor 100.

In one embodiment, emitter region 130 and collector region 140 may be formed on opposing sides of base overlie structure 120, and base overlie structure 120 may align over and mask base region 150 during formation of emitter region 130 and collector region 140. For example, emitter region 130 and collector region 140 may be formed by implantation of a doping material in the first region 130 and second region 140, the doping material having the second conductivity type. Base overlie structure 120 may mask base region 150 to prevent implantation of the dopant in the base region 150 and preserve the first conductivity type in the base region 150. Base overlie structure 120 may thus be self-aligned with base region 150 to separate emitter region 130 from collector region 140, and a width of base overlie structure 120 may define a width of base region 150. Advantageously, the process used to form base overlie structure 120 may be controlled to form base overlie structure 120 at the smallest size achievable for the process, and thus controlled to form base region 150 at the smallest width possible. For example, base overlie structure 120 may be in the range 5-50 nm wide, so that base region 150 has a corresponding width of 5-50 nm. A bipolar junction transistor's performance depends, in part, on the size of base region 150 as a larger base region increases the likelihood that electrical carriers (e.g., electrons for N or N+ type regions) diffusing out of the emitter will undesirably recombine with the majority carriers (e.g., holes for P type regions) of the base region before diffusing into the collector region, thus reducing the net collector current obtained. Forming a narrow base region 150 using base overlie structure 120, as for example described above, may thus reduce the number of carriers diffusing out of emitter region 130 that recombine within base region 150, thus maximizing the obtained collector current through collector 140.

In one exemplary embodiment, dielectric layer 122 may be a first dielectric layer, and base overlie structure 120 may also include a second dielectric layer over conductive material layer 121; the first dielectric layer and second dielectric layer may electrically isolate conductive material layer 121. In embodiments in which conductive material layer 121 is electrically isolated by a first dielectric layer 122 and a second dielectric layer, conductive material layer 121 may include an electrical charge, the charge being selected to facilitate operation of bipolar junction transistor 100 at low voltage. The electrical charge on conductive material layer 121 may, for example, provide an initial voltage between base region 150 and emitter region 130. The initial voltage may be below threshold voltage needed to switch the bipolar junction transistor "on," so that the charge on conductive material layer 121 does not continually drive current through the transistor. When additional voltage is applied to one or more base contacts (described herein below), the initial voltage and additional voltage together may act to turn the bipolar transistor on and drive electrical carrier diffusion from emitter 130 to collector 140. The additional voltage applied to one or more base contacts may thus be relatively low compared to the net voltage required to operate the bipolar junction transistor, allowing for low voltage operation of the bipolar junction transistor. Low voltage operation of the bipolar junction transistor may, for example, improve low power performance of the transistor in, for instance, RF applications. In one instance, the electrical charge of the conductive material layer may be a fixed electrical charge. In another instance, the charge of the conductive material layer may be dynamically selected or altered to facilitate low-voltage operation of bipolar junction transistor 100.

Figure 1B:
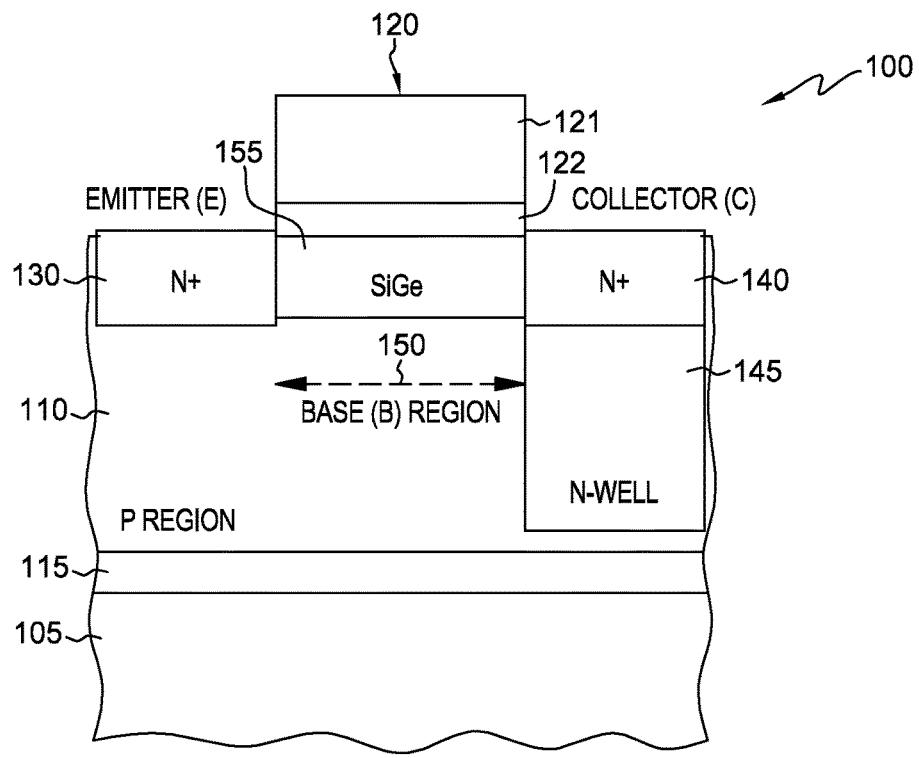
FIG. 1B depicts a cross-sectional view of another embodiment of the bipolar junction transistor structure of FIG. 1A, illustrating additional features of the structure that may be included to facilitate operation of the bipolar junction transistor at low voltages and reduce parasitic resistances and capacitances in the structure, in accordance with one or more aspects of the present invention.

FIG. 1B depicts bipolar junction transistor 100 of FIG. 1A with additional elements that may be included in one or more alternative embodiments, the additional elements being optionally included to further improve the performance of and/or facilitate operation of bipolar junction transistor at low voltage. Generally, the performance of a bipolar junction transistor may be measured according to the gain in collector current obtained. Maximizing collector current may not only depend in part on minimizing the width of the base region, as described above, but may also depend on minimizing parasitic resistances and parasitic capacitances within the bipolar junction transistor. This may include, for example, minimizing resistance within the base region, minimizing resistance of the collector region, reducing parasitic capacitance between the base region and emitter region, and so on. Reducing or eliminating sources of parasitic resistances and parasitic capacitances may improve the speed and performance of the bipolar junction transistor, and may also further facilitate operation of the bipolar junction transistor at low voltages.

In one embodiment, bipolar junction transistor 100 may include a well region 145 within substrate region 110 below collector region 140, in which well region 145 has the second conductivity type. For example, well region 145 may be N-type if collector region 140 is N-type or N+ type, as depicted in FIG. 1B. Well region 145 may be provided below collector region 140 to increase an effective size of the collector of bipolar junction transistor 100, resulting in lower electrical resistance in collector region 140. Well region 145 may be formed, in one instance, by etching a trench in a portion of substrate region 110 followed by filling the trench with a doped material having the second conductivity type. Well region 145 may be formed, in another instance, by deep implantation of a dopant material into a portion of substrate region 110 over which collector region 140 is to be formed. It may be understood that well region 145 having the second conductivity type need not be confined to a region immediately below collector 140. In alternative embodiments, well region 145 may extend within substrate region 110 beyond the region directly below collector 140, and may extend not only vertically within substrate region 110 (as depicted by FIG. 1A) but also laterally within substrate region 110.

In another embodiment, base region 150 may include a material 155 with a strained lattice structure, such as silicon-germanium (SiGe), as depicted in FIG. 1B, or a periodic III-IV compound such as GaAs. It may be understood that other materials may alternatively be used to form a base region 150 with a strained lattice structure. The strained lattice structure of material 155 may be advantageously selected to increase the mobility of electrical carriers within base region 150, with the increased electrical carrier mobility facilitating diffusion of electrical carriers from emitter 130 through base region 150 into collector 140 during operation of bipolar junction transistor 100. For example, when emitter 130 and collector 140 are N+ type, the electrical carriers are electrons that diffuse out of emitter 130 through base region 150, and because base region 150 is P type, in which the majority carriers are holes, the electrons diffusing through base region 150 may undesirably recombine with holes in base region 150 and thus may not reach collector 140. By increasing the mobility of the electrical carriers through the use of material 155 with a strained lattice structure, the electrical carriers may more quickly reach collector 140 without recombining within base region 150. In one exemplary embodiment, a base region 150 including a material 155 with a strained lattice structure may be formed by providing a substrate 105 with a substrate region 110 having a first lattice structure and a first lattice spacing, removing at least the portion of substrate region 110 to be defined as base region 150 to form a trench, and growing material 155 in the trench, in which material 155 has a second lattice structure and second lattice spacing different from the first lattice structure and spacing. The portion of substrate region 110 removed may be removed, for example, by a lithographic etch process. Growing material 155 in the trench may include, for example, an epitaxial growth process. As material 155 grows in the formed trench, it may conform to the first lattice spacing and first lattice structure of substrate region 110. Due to the difference in sizes between the first lattice spacing and the second lattice spacing, the material 155 may acquire a strained lattice structure through conforming to the first lattice spacing and first lattice structure.

In another embodiment, bipolar junction transistor 100 may include an oxide layer 115 below substrate region 110. Oxide layer 115 may underlie, at least in part, emitter region 130 and/or collector region 140, and/or base region 150. Oxide layer 115 may be included to reduce parasitic capacitance that may arise between one or more components of bipolar junction transistor 100, such as emitter region 130 or base region 150, and substrate 105 or substrate region 110.

Figure 1C:
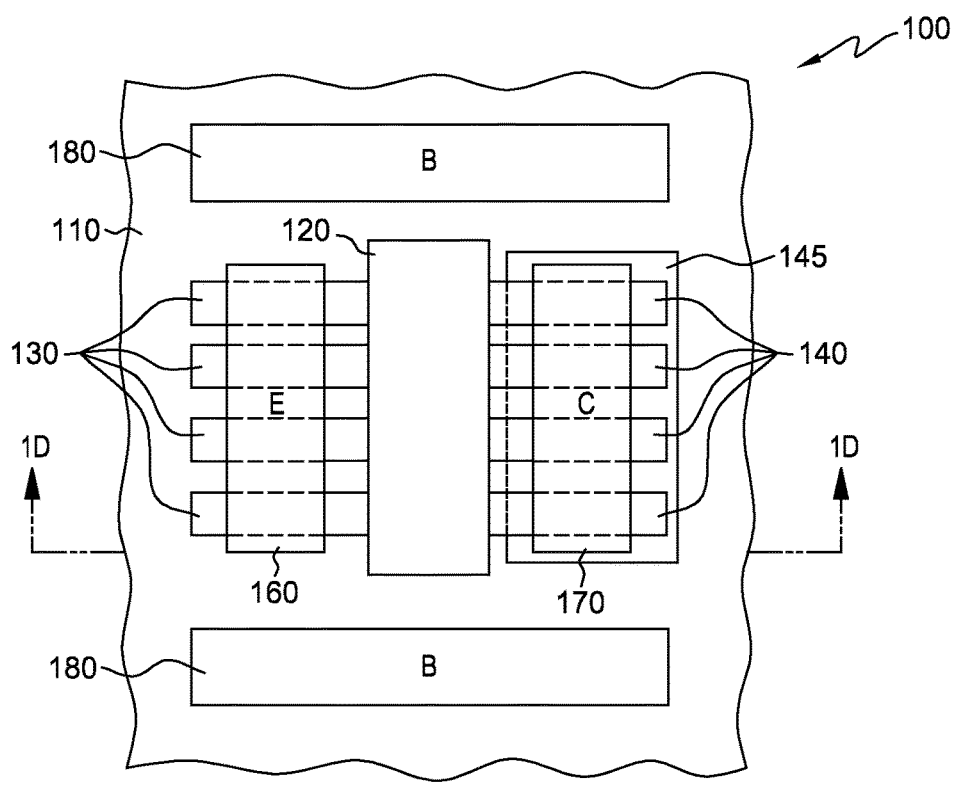
FIG. 1C depicts a top-down view of another embodiment of the bipolar junction transistor structure of FIG. 1A, illustrating further elements that may be included in the structure to facilitate operation of the bipolar junction transistor at low voltage and reduce parasitic resistances and capacitances in the structure, in accordance with one or more aspects of the present invention.
Figure 1D:
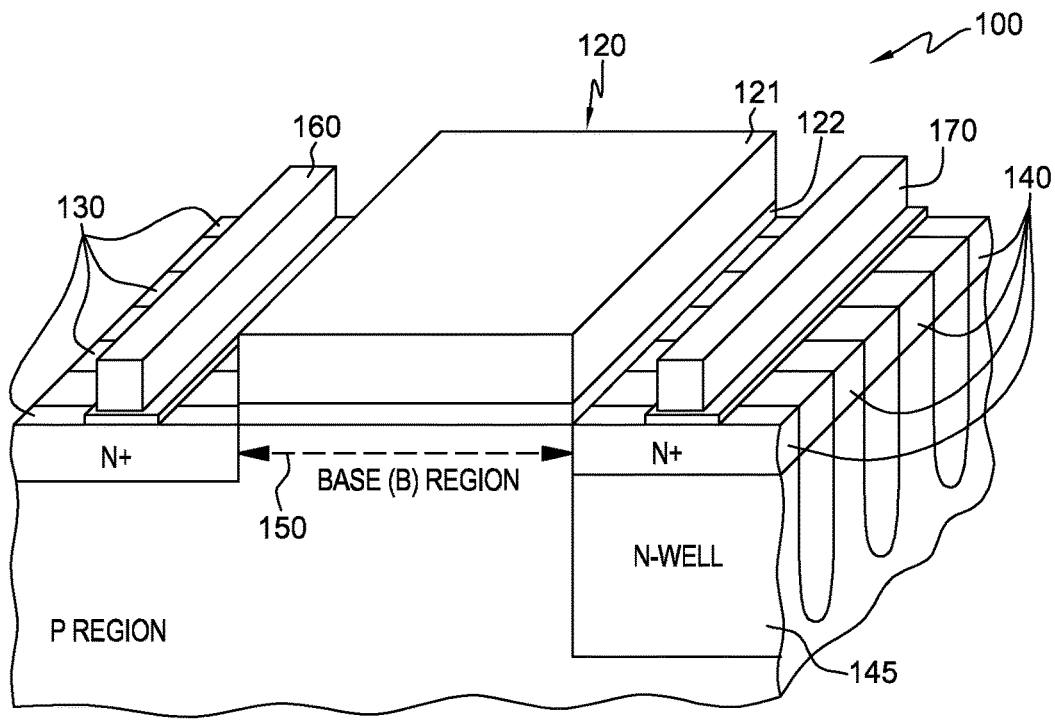
FIG. 1D is an isometric cross-sectional view of one embodiment of the bipolar junction transistor structure of FIG. 1C, further illustrating elements depicted in FIG. 1C, in accordance with one or more aspects of the present invention.

FIGS. 1C and 1D further illustrate additional elements and features that may be included in one or more embodiments of bipolar junction transistor 100. FIG. 1C depicts a top-down view of one embodiment of bipolar junction transistor 100, and FIG. 1D is an isometric cross-sectional view of a portion of bipolar junction transistor 100 depicted by FIG. 1C, furthering illustrating additional elements that may be included in bipolar junction transistor 100 to further improve performance and/or facilitate low-voltage operation. For example, in one embodiment, bipolar junction transistor 100 may include a plurality of base contacts 180 electrically contacting substrate region 110. A first base contact of the plurality of base contacts 180 may be disposed adjacent to a first end of the base region 150 (below base overlie structure 120, not depicted in FIG. 1C) and a second base contact of the plurality of base contacts 180 may be disposed adjacent a second end of the base region 150. The plurality of base contacts 180 may advantageously minimize electrical contact resistance to base region 150, as the plurality of base contacts effectively increases a contact area between plurality of base contacts 180 and base region 150, allowing electrical carriers to flow at lower resistance. Consequently, lowering the resistance within base region 150 facilitates operation of bipolar junction transistor at a proportionally lower voltage.

In one example, the plurality of base contacts may include a material with a strained lattice structure, such as silicon-germanium (SiGe) or a periodic III-IV compound such as GaAs. It may be understood that other materials may alternatively be used to form a base contacts 180 with a strained lattice structure. The strained lattice structure of base contacts 180 may be advantageously selected to increase the mobility of electrical carriers through base contacts 180 and base region 150, resulting in an increased flow of majority electrical carriers from base region 150 into emitter region 130. As the flow of majority electrical carriers from base region 150 into emitter region 130 causes diffusion of electrical carriers out of emitter 130 through base region 150, increasing the mobility of majority carriers in base region 150 may result in increased current flowing into collector region 140, advantageously increasing the gain of bipolar junction transistor 100.

In another embodiment, bipolar junction transistor 100 may include at least one emitter contact 160 over emitter region 130 and at least one collector contact 170 over collector region 140. The at least one emitter contact 160 and at least one collector contact 170 may, in one instance, include a silicide material, such as palladium silicide or titanium silicide. A silicide emitter contact 160 and collector contact 170 may be formed, for example, via a silicidation process. A silicide material may have a low electrical resistivity compared to other electrical contact materials, and thus may facilitate lowering electrical resistance within emitter region 130 and collector region 140.

In yet another embodiment, emitter region 130 may be one emitter region of a plurality of emitter regions 130, and collector region 140 may be one collector region of a plurality of collector regions 140. The plurality of emitter regions 130 may, in one example, be a plurality of emitter regions formed in the upper portions of a plurality of fin structures that have been formed in substrate region 110. Similarly, the plurality of collector regions 140 may, in one example, be a plurality of collector regions formed in the upper portions of a plurality of fin structures formed in substrate region 110. The plurality of fin structures may, for example, be formed in substrate region 110 at the same time in a single process, so that the resulting plurality of emitters 130 and plurality of collectors 140 are aligned with each other and separated by base overlie structure 120. Base overlie structure may 120, in one example, mask base region 150 during formation of a plurality of fin structures. In another example, base overlie structure 120 may be provided following formation of the plurality of fin structures and prior to formation of the plurality of emitter regions 130 and plurality of collector regions 140. In embodiments including well region 145 below collector region 140, the plurality of collector regions 140 may further be in contact with one well region 145, as depicted in FIG. 1C. Alternatively, a plurality of well regions 145 may be formed below the plurality of collector regions 140, the plurality of well regions 145 being aligned with the plurality of collector regions 140.

In embodiments including a plurality of emitter regions 130 and a plurality of collector regions, the at least one emitter contact 160 may be in electrical contact with the plurality of emitter regions 130, and the at least one collector contact 170 may be in electrical contact with the plurality of collector regions 140, as depicted in FIG. 1C and also depicted in FIG. 1D. By connecting the plurality of emitter regions 130 with the at least one emitter contact 160, the plurality of emitter regions 130 may effectively be controlled as a single emitter of bipolar junction transistor 100. Similarly, connecting the plurality of collector regions 140 with the at least one collector contact 170 may effectively control the plurality of collector regions 140 as a single collector of bipolar junction transistor 100. Advantageously, forming a plurality of emitter regions 130 and a plurality of collector regions 140 may increase the gain (i.e., the ratio of the collector current to the base current) of bipolar junction transistor 100. As FIGS. 1C and 1D illustrate, each of the plurality of emitter regions 130 and plurality of collector regions 140 forms a narrow interface junction with base region 150. During operation of bipolar junction transistor 100, electrical carriers in one of the plurality of emitter regions 130 (i.e., electrons) may be more densely concentrated near the narrow junction interface with base region 150, allowing the carriers to diffuse more rapidly into base region 150 and into collector region 140, thus reducing losses due to recombination in base region 150 and increasing current gain in collector region 140. The narrower interface junction between emitter region 130 and base region 150, as well as collector region 140 and base region 150, may also increase parasitic resistance in base region 150. The number and size of the plurality of emitter regions 130 and collector regions 140 may be selected, depending on design requirements of the circuit structure and materials used in forming substrate region 110 and emitter region 130 and collector region 140, to optimize the gain of bipolar junction transistor 100 while maintaining low parasitic resistance in base region 150.

The arrangement of a plurality of base contacts 180, emitter contact 160 and collector contact 170 depicted by FIGS. 1C-1D illustrate just one possible arrangement of contacts for a bipolar junction transistor according to structures and methods disclosed herein. Embodiments of bipolar junction transistor structures disclosed herein, or alternative embodiments thereof, may allow for or be adapted to many alternative contact arrangements, according to specific design requirements for circuit structures intended for particular applications.

Figure 2A:
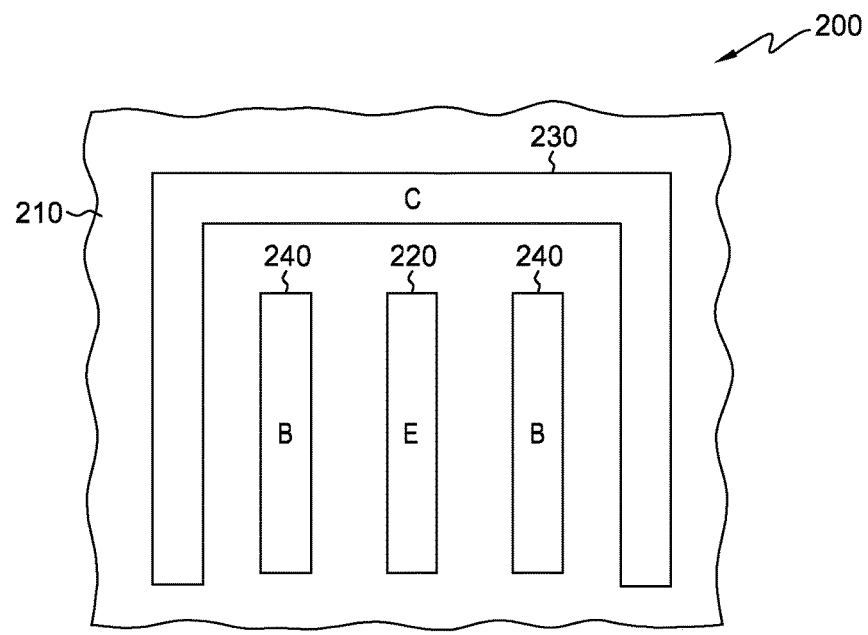
FIGS. 2A-2B depict top-down views of embodiments of alternative contact arrangements that may be used in conjunction with the bipolar junction transistor structures described herein, in accordance with one or more aspects of the present invention.

For example, FIG. 2A depicts one embodiment of an arrangement of contacts for a bipolar junction transistor 200 as disclosed herein. In the contact arrangement depicted, at least one emitter contact 220 may be arranged intermediate a plurality of base contacts 240, the base contacts being in electrical contact with substrate region 210. Base contacts 240 may be arranged to parallel the at least one emitter contact 220, and at least one emitter contact 220 may be arranged parallel to or perpendicular to an emitter region or a plurality of emitter regions (not depicted in FIG. 2A), according to one or more embodiments of a bipolar junction transistor as described herein. Collector contact 230 may be larger than base contacts 240 and emitter contact 230, and may be arranged to at least partially encircle plurality of base contacts 240 and at least one emitter contact 220, as depicted by the example in FIG. 2A. A larger collector contact 230 that at least partially encircles base contacts 240 and emitter contact 220 may, in one example, be in electrical contact with a collector region or well region below the collector region, where the collector region and/or well region are similarly configured to partially encircle a base region and emitter region. A collector region larger than the base region may facilitate increasing the gain of the bipolar junction transistor, as the larger collector region may collect stray electrical carriers that diffuse out of the emitter region but do not travel in a straight path through the base region. In one example, the plurality of base contacts 240 may also be a plurality of base overlie structures 120, as described herein above in FIGS. 1A-1D; thus, in at least one example embodiment, the base overlie structure may also function as a base contact 240.

Figure 2B:
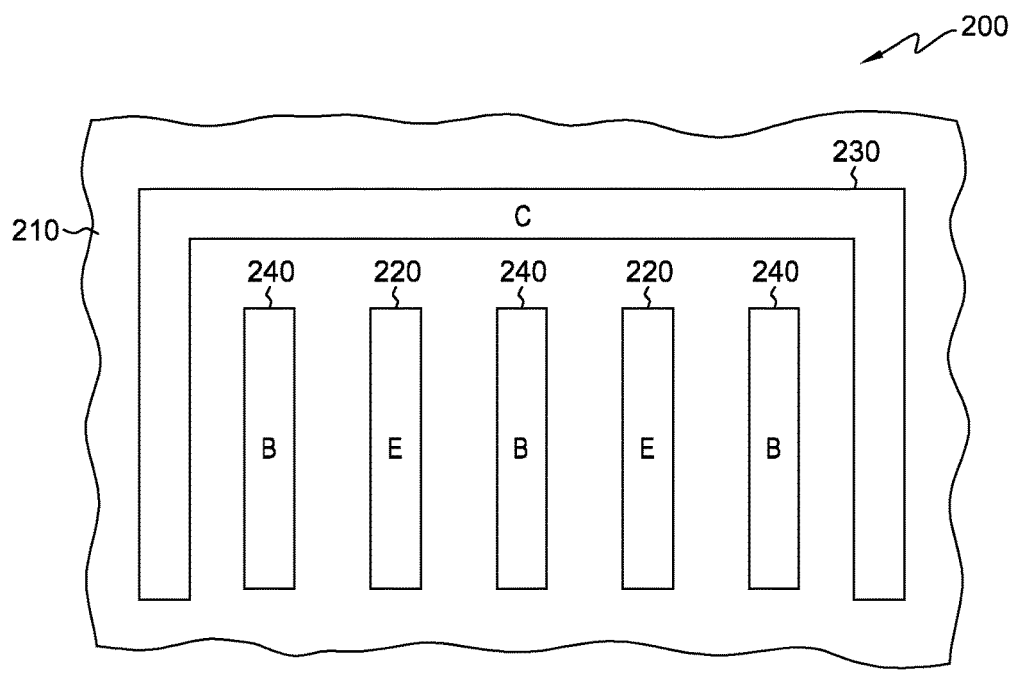

FIG. 2B depicts one possible alternative embodiment of an arrangement of contacts similar to the arrangement of contacts depicted in FIG. 2A, in which additional base contacts 240 and a plurality of emitter contacts 220 are arranged in parallel with each other, along with collector contact 230. Including multiple base contacts 240 and multiple emitter contacts 220 may further reduce parasitic resistances in the base region of the bipolar junction transistor, and thus may further facilitate increasing the gain of the transistor structure as well as facilitate operation of the bipolar junction transistor at low voltages.

Figure 3:
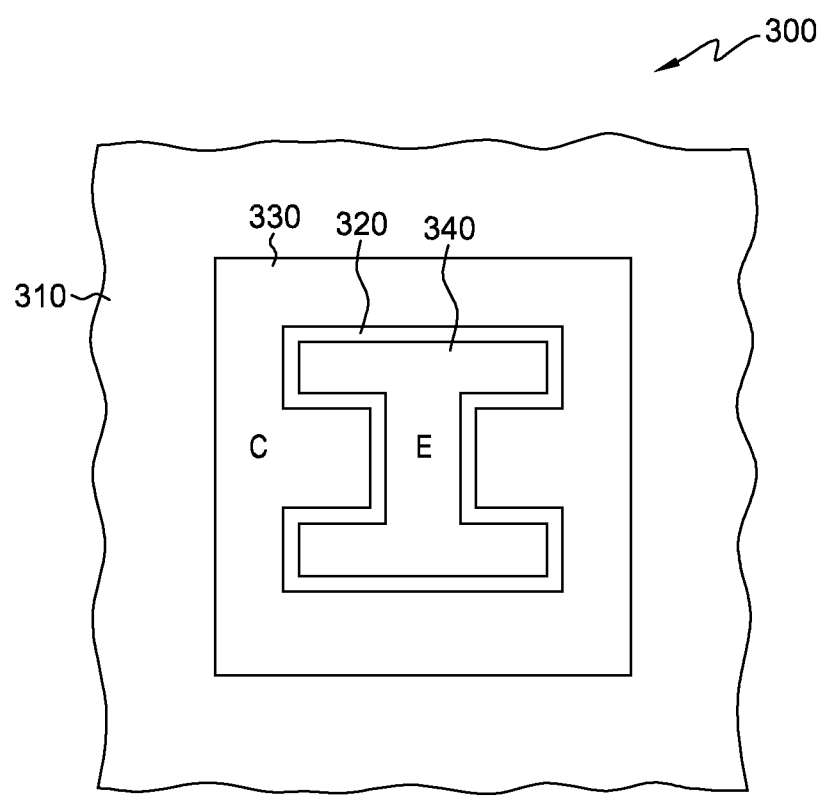
FIG. 3; depicts a top-down view of one embodiment of another alternative contact arrangement that may be used in conjunction with the bipolar junction transistor structures described herein, in accordance with one or more aspects of the present invention; and, FIG. 4 illustrates one embodiment of a method of forming a bipolar junction transistor, in accordance with one or more aspects of the present invention.

FIG. 3 depicts yet another embodiment of an arrangement of contacts for a bipolar junction transistor 300 as disclosed herein. The contact arrangement depicted in FIG. 3 may be ideal, for example, for RF bipolar junction circuit structures. Emitter contact 320 may be fully encircled by collector contact 330 as well as base contact 340 and the base region underlying base contact 340. The contact arrangement depicted may facilitate collection of electrical carriers by collector contact 330, as electrical carriers diffusing through the base region may not travel along a diffusion path that does not end at collector contact 330. In one example, base contact 340 may also be the base overlie structure 120, described herein above and depicted in FIGS. 1A-1D; thus, in at least one example embodiment, the base overlie structure may also function as a base contact 340.

Figure 4:
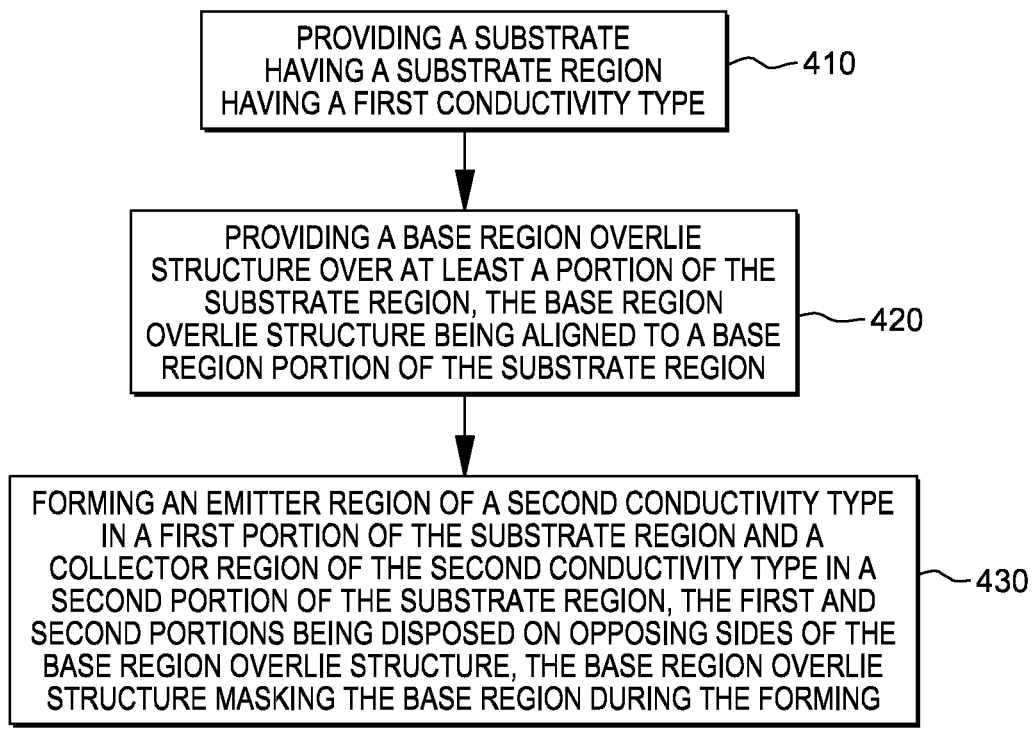

FIG. 4 depicts, by way of summary, one embodiment of a method of forming a circuit structure, the method including fabrication of a bipolar junction transistor, in accordance with one or more aspects of the present invention. In the embodiment illustrated, the process may include, for example, providing a substrate including a substrate region having a first conductivity type 410. The first conductivity type may, for instance, be P-type. A base region overlie structure may be provided over at least a portion of the substrate region, the base region overlie structure being aligned to a base region portion of the substrate region 420. Providing the base region overlie structure may include, in one example, providing a dielectric layer over the substrate region and providing a conductive material layer over the dielectric layer. An emitter region of a second conductivity type may be formed in a first portion of the substrate region, and a collector region of the second conductivity type may be formed in a second portion of the substrate region 430. The first and second portions may be disposed on opposing sides of the base region overlie structure, and the base overlie structure may mask the base region in the substrate region during formation of the emitter region and the collector region. The second conductivity type may, for instance, be N-type.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:
1. A method comprising:
    fabricating a bipolar junction transistor, the fabricating comprising:
        providing a substrate comprising a plurality of fins extending above the substrate;
        providing a plurality of base regions having a first conductivity type, the plurality of base regions comprising center portions of the plurality of fins;
        forming a plurality of emitter regions having a second conductivity type, the plurality of emitter regions comprising first upper portions of the plurality of fins;
        forming a plurality of collector regions having the second conductivity type, the plurality of collector regions comprising second upper portions of the plurality of fins; and,
        forming a base region overlie structure disposed over, in part, the plurality of base regions, the base region overlie structure separating the plurality of emitter regions from the plurality of collector regions and aligning to the plurality of base regions, wherein a width of the base region overlie structure defines a width of the plurality of base regions.
2. The method of claim 1, wherein the base region overlie structure comprises a dielectric layer over the plurality of base regions and a conductive material layer over the dielectric layer.
3. The method of claim 2, wherein the dielectric layer is a first dielectric layer and the base region overlie structure further comprises a second dielectric layer over the conduc- tive material layer, wherein the conductive material layer is electrically isolated by the first dielectric layer and second dielectric layer.

4. The method of claim 3, wherein the conductive material layer comprises an electric charge, the electric charge selected to facilitate operation of the bipolar junction transistor at low voltage.

5. The method of claim 4, wherein the electric charge of the conductive material layer is a fixed electrical charge.

6. The method of claim 1, further comprising a plurality of base contacts, the plurality of base contacts electrically contacting the substrate, wherein a first base contact of the plurality of base contacts is disposed adjacent to one fin of the plurality of fins and a second base contact of the plurality of base contacts is disposed adjacent to an other fin of the plurality of fins, and wherein the plurality of base contacts minimize electrical contact resistance to the plurality of base regions to further facilitate operation of the bipolar junction transistor at low voltage.

7. The method of claim 6, wherein the plurality of base contacts comprise a material with a strained lattice structure, wherein the strained lattice structure is selected to increase electrical carrier mobility, the increased electrical carrier mobility facilitating diffusion of electrical carriers from the base region into the emitter region.

8. The method of claim 1, further comprising at least one emitter contact over the plurality of emitter regions and at least one collector contact over the plurality of collector regions.

9. The method of claim 8, wherein the at least one emitter contact and at least one collector contact comprise a silicide material.

10. The method of claim 1, wherein the plurality of base regions comprise a material with a strained lattice structure, wherein the strained lattice structure is selected to increase electrical carrier mobility, the increased electrical carrier mobility facilitating diffusion of electrical carriers from the emitter region through the base region to the collector region.

11. The method of claim 1, further comprising a well region within the substrate below the plurality of collector regions, the well region having the second conductivity type, wherein the well region increases an effective size of the plurality of collector regions to minimize electrical resistance in the plurality of collector regions.

12. The method of claim 1, wherein the first conductivity type is p-type and the second conductivity type is n-type.

13. The method of claim 1, further comprising an oxide layer disposed below the plurality of fins, wherein the oxide layer facilitates reducing parasitic capacitance within the bipolar junction transistor.

14. A method comprising:
fabricating a bipolar junction transistor, the fabricating comprising:
providing a substrate comprising a fin extending above the substrate;
providing a base region having a first conductivity type, the base region comprising a center portion of the fin;
forming an emitter region having a second conductivity type, the emitter region comprising first upper portion of the fin;
forming a collector region having the second conductivity type, the collector region comprising a second upper portion of the fin; and,
forming a base region overlie structure disposed over, in part, the base region, the base region overlie structure separating the emitter region from the collector region and aligning to the base region, wherein a width of the base region overlie structure defines a width of the base region.

15. The method of claim 14, wherein the base region overlie structure comprises a dielectric layer over the base region and a conductive material layer over the dielectric layer.

16. The method of claim 15, wherein the dielectric layer is a first dielectric layer and the base region overlie structure further comprises a second dielectric layer over the conductive material layer, wherein the conductive material layer is electrically isolated by the first dielectric layer and second dielectric layer.

17. The method of claim 16, wherein the conductive material layer comprises an electric charge, the electric charge selected to facilitate operation of the bipolar junction transistor at low voltage.

18. The method of claim 17, further comprising at least one base contact electrically contacting the substrate and disposed adjacent the fin, and wherein the at least one base contact minimizes electrical contact resistance to the base region to further facilitate operation of the bipolar junction transistor at low voltage.

19. The method of claim 18, wherein the base contact comprises a material with a strained lattice structure, wherein the strained lattice structure is selected to increase electrical carrier mobility, the increased electrical carrier mobility facilitating diffusion of electrical carriers from the base region into the emitter region.

20. The method of claim 14, further comprising at least one emitter contact over the emitter region and at least one collector contact over the collector region.

* * * * *